US012748187B2

(12) United States Patent
Dupont

(10) Patent No.: US 12,748,187 B2
(45) Date of Patent: Sep. 29, 2026

(54) DEVICE FOR CONVERTING A PHOTONIC SIGNAL, ASSOCIATED LIDAR AND METHOD

(71) Applicant: Commissariat à l'énergie atomique et aux énergies alternatives, Paris (FR)

(72) Inventor: Bertrand Dupont, Grenoble Cedex (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 489 days.

(21) Appl. No.: 18/549,787

(22) PCT Filed: Mar. 11, 2022

(86) PCT No.: PCT/EP2022/056404
§ 371 (c)(1),
(2) Date: Sep. 8, 2023

(87) PCT Pub. No.: WO2022/189660
PCT Pub. Date: Sep. 15, 2022

(65) Prior Publication Data

US 2024/0168140 A1 May 23, 2024

(30) Foreign Application Priority Data

Mar. 12, 2021 (FR) ...................................... 21 02459

(51) Int. Cl.
*H03F 3/45* (2006.01)
*G01S 7/481* (2006.01)
*G01S 7/4912* (2020.01)

(52) U.S. Cl.
CPC .......... *G01S 7/4816* (2013.01); *G01S 7/4917* (2013.01); *H03F 3/45479* (2013.01)

(58) Field of Classification Search
None
See application file for complete search history.

(56) References Cited

U.S. PATENT DOCUMENTS 5,134,276 A * 7/1992 Hobbs .................. H01S 3/1303 250/208.2
9,509,413 B2 * 11/2016 Suzuki ................ H03F 3/45085
(Continued)

FOREIGN PATENT DOCUMENTS

EP 1 589 536 A2 10/2005
EP 1 589 536 A3 10/2005

OTHER PUBLICATIONS

International Search Report issued Jun. 3, 2022 in PCT/EP2022/056404, filed on Mar. 11, 2022, 7 pages (with English Translation).
(Continued)

*Primary Examiner* — Hovhannes Baghdasaryan
(74) *Attorney, Agent, or Firm* — Oblon, McClelland, Maier & Neustadt, L.L.P.

(57) ABSTRACT

A device for converting a photonic signal to be analyzed includes two output branches, and one input for receiving a photonic signal to be analyzed and splitting off a part of the photonic signal to each output branch. The device imposes a phase shift of approximately 180 degrees between the two parts, each output branch including a photodiode generating a respective first electrical current. Each output branch generates a second electrical current according to a value of the first current of the branch considered. The device also includes an amplifier generating an output signal according to a difference between the values of the second currents, a gain being defined for each output branch, and at least one electronically controlled adjustment element configured to modify one of the gains.

11 Claims, 6 Drawing Sheets

(56) References Cited

U.S. PATENT DOCUMENTS

| | | | | |
|---|---|---|---|---|
| 2003/0076484 | A1* | 4/2003 | Bamji | G01S 17/36 356/5.1 |
| 2011/0228280 | A1 | 9/2011 | Schmitt et al. | |

OTHER PUBLICATIONS

French Preliminary Search Report issued Nov. 24, 2021 in FR 21 02459, filed on Mar. 12, 2021, 3 pages (with English Translation of Categories of Cited Documents).

* cited by examiner

DEVICE FOR CONVERTING A PHOTONIC SIGNAL, ASSOCIATED LIDAR AND METHOD

CROSS-REFERENCE TO RELATED APPLICATIONS

This application is the U.S. national phase of International Application No. PCT/EP2022/056404 filed 11 Mar. 2022, which designated the U.S. and claims priority to French Patent Application No. 21 02459 filed 12 Mar. 2021, the entire contents of each of which are hereby incorporated by reference.

FIELD

The present invention relates to a device for converting a photonic signal, as well as to a lidar comprising such a conversion device and to a mobile platform equipped with such a lidar. The present invention further relates to a method for controlling such a conversion device.

BACKGROUND

Photonic signal conversion devices are commonly used in optical devices such as lidars, for generating an electrical signal according to the photonic signal.

More particularly, in certain applications, the photonic signal is divided into two parts, each of which is transmitted to a corresponding photodiode, one of the two parts being out of phase by about 180 degrees with respect to the other. Thereby, the comparison of the output currents of the two photodiodes, in particular the subtraction of the two currents, is used for removing the DC component (which is not affected by the phase shift) of the resulting current in order to keep only the variable part. The electrical current resulting from the comparison of the output currents of the two photodiodes is then amplified before being analyzed in order to extract the information sought.

Such assemblies can thus be used for extracting an alternating electrical signal from the mixing between two photonic signals. The assemblies are used in particular in FMCW (Frequency Modulation Continuous Wave) lidars which use the emission of a photonic signal the frequency of which varies over time. Thereby, when the emitted photonic signal is reflected or scattered by a target, the frequency difference between the reflected or scattered signal received at one instant by the lidar and the signal emitted at the same instant is a function of the distance between the lidar and the target. In particular, the mixing of the emitted signal and of the received signal forms a photonic signal from which it is possible to extract, after traveling through the photodiodes, an electrical signal, the variable part of which has a beat frequency which is a function of the difference between the frequencies of the two mixed signals and hence of the distance between the lidar and the target.

U.S. Pat. No. 2011/0228280 A1 relates to a device for converting a photonic signal, of the aforementioned type.

However, the assemblies used in the existing conversion devices are not optimized. More particularly, when the electrical signal to be analyzed includes a continuous or slowly varying component, the variable part of the electrical signal is often difficult to amplify sufficiently without saturating the device when the variable part has a low amplitude.

SUMMARY

There is thus a need for a device for converting a photonic signal, which can be used for the analysis of corresponding electrical signals the variable part of which has a lower amplitude than the conversion devices of the prior art.

To this end, a device for converting a photonic signal to be analyzed is proposed, the conversion device including:

- a photonic-electric conversion element, and
- an electronic processing device,
- the conversion element including a splitter having two outputs connected to a first output branch and to a second output branch, respectively, the splitter including one or two inputs for receiving one or two input photonic signals, respectively, the splitter mixing the input photonic signals in the case where two inputs are present, the received single photonic input signal or the mixing of the two received photonic signals corresponding to a photonic signal to be analyzed, the splitter conducting a first part of the photonic signal to be analyzed to the first output branch and conducting a second part of the photonic signal to be analyzed to the second output branch, the conversion element being configured for imposing, via the splitter, a phase shift of approximately 180 degrees between the first and the second parts of the photonic signal to be analyzed, each first or second output branch including a waveguide portion and a photodiode,
- each photodiode being configured for generating a respective first electrical current in response to receiving the first or second part of the photonic signal to be analyzed,
- each output branch being configured for generating at the output, a second electrical current having a value equal to or multiple of a value of the first electrical current of the output branch concerned, the processing device comprising an amplifier configured for generating at least one output signal depending on a difference between the values of the two second electrical currents,
- a gain being defined for each output branch, the gain being a coefficient of proportionality between the value of the second electrical current of the output branch considered and a photonic power of the first or second part of the photonic signal to be analyzed, received by said output branch,
- the conversion device including at least one electronically controlled adjustment element, apt to modify one of the gains, the processing device including a first regulation loop comprising a low-pass filter and a device for controlling each adjustment element, the regulation loop receiving said output signal from said amplifier and producing an electrical control signal for each adjustment element so as to regulate the mean value of each output signal to a predefined setpoint value corresponding to the equalization of the DC components of the values of the two second electrical currents,
- each photodiode having a quantum efficiency, with at least one adjustment element configured for modifying the quantum efficiency of a corresponding photodiode.

According to advantageous, yet not mandatory embodiments, the conversion device has one or a plurality of the following features, taken individually or according to all technically possible combinations:

- each adjustment element is configured for modifying a coefficient of proportionality between the value of the first electrical current of the corresponding output branch and the photonic power of the first or second part of the photonic signal to be analyzed, received by said output branch.

each photodiode has an anode and a cathode, each adjustment element being configured for modifying an electrical voltage between the anode and the cathode of the corresponding photodiode.

each adjustment element includes a transistor connected in series with the photodiode of the corresponding output branch, each transistor including a gate or a base, the regulation loop being configured for modifying a gate voltage or a base voltage of the transistor.

the processing device includes a differential amplifier having a first input connected to a voltage reference, the photodiodes of the two output branches being connected in series in the same direction with each other, the anode of one photodiode being connected to the cathode of the other, by means of a first electrical circuit portion, the second input of the differential amplifier being electrically connected to the intermediate point of the first electrical circuit portion.

each transistor connects the photodiode of the corresponding output branch and the intermediate point electrically connected to the second input of the differential amplifier.

at least one adjustment element includes a current splitter, the current splitter being positioned between a photodiode of a given branch and said intermediate point electrically connected to the second input of the differential amplifier configured for modifying a coefficient of proportionality between the values of the first current and of a second current of said given branch.

each output branch includes a current generator connected in series with the corresponding photodiode, each current generator being connected to the distinct photodiode by a respective second circuit portion, the differential amplifier having first and second inputs each correspondingly connected to an intermediate point of a respective second portion of electrical circuit, and wherein the differential amplifier is configured for generating two output signals, and further comprising a second regulation loop receiving the two output signals of said amplifier and producing a common electrical control signal from said control generators so as to regulate the average of the voltages present on the two outputs to a predefined setpoint value, the first regulation loop producing an electrical control signal for at least one adjustment element so as to regulate the average of each voltage present on one of the outputs to the same predefined setpoint value corresponding to the equalization of the DC components of the intensities of the second currents.

the conversion device includes one or a plurality of elementary conversion devices, the same input photonic signal or signals being fed into each elementary conversion device, the splitters of each of the devices being different or forming a single splitter shared by the conversion devices, the splitter or the splitters forming a plurality of pairs of output signals, each pair of output signals being associated with an elementary conversion device and fed into the respective first and second output branches of the elementary conversion devices, the signals of the same pair having a phase shift of approximately 180 degrees with respect to each other, the signals of different pairs having a phase shift with respect to each other, and wherein the output signals of the amplifiers of the elementary conversion devices are transmitted to an analysis device.

The conversion device includes two elementary conversion devices, and the four output signals of the splitter or of the splitters are in phase quadrature.

A lidar is also proposed which includes a stage for transmitting a photonic signal to a target, a stage for receiving a photonic signal scattered by the target and a conversion device as described hereinabove, the transmission stage being configured for injecting a part of the transmitted signal into one of the inputs of the splitter or into a waveguide forming an input branch connected to an input of the splitter, the reception stage being configured for injecting the scattered signal into another input of the splitter or into said waveguide forming said input branch, the photonic signal to be analyzed being formed by the mixing of the signals injected into the two inputs of the splitter or into said waveguide forming the input branch.

A method for controlling a conversion device is also proposed, including:

a photonic-electric conversion element, and an electronic processing device, the conversion element including a splitter having two outputs connected to a first output branch and to a second output branch, respectively, the splitter including one or two inputs for receiving one or two input photonic signals, respectively, the splitter mixing the input photonic signals in the case where two inputs are present, the received single input signal received or the mixing of the signals corresponding to a photonic signal to be analyzed, the splitter conducting a first part of the photonic signal to be analyzed to the first output branch and conducting a second part of the photonic signal to be analyzed to the second output branch, the conversion element being configured for imposing, via the splitter, a phase shift of approximately 180 degrees between the first and the second parts of the photonic signal to be analyzed, each first or second output branch including a waveguide portion and a photodiode, each photodiode being configured for generating a respective first electrical current in response to the reception of the first or second part of the photonic signal to be analyzed, each photodiode having a quantum efficiency, each output branch being configured for generating at the output, a second electrical current having a value equal to or multiple of a value of the first electrical current of the output branch concerned, the processing device comprising an amplifier configured for generating at least one output signal according to a difference between the values of the two second electrical currents, a gain being defined for each output branch, the gain being a coefficient of proportionality between the value of the second electrical current of the output branch considered and a photonic power of the first or second part of the photonic signal to be analyzed, received by said output branch, the method including the steps of:

low-pass filtering, by a regulation loop, of the output signal, for obtaining a filtered signal, generation, by the regulation loop, as a function of the filtered signal, of an electrical control signal of at least one electronically controlled adjustment element, and transmission of the control to the adjustment element and modification of one of the first gains by the adjustment element according to the control received, so as to regulate the mean value of each output signal to a predefined setpoint value corresponding to the equalization of the DC components of the values of the two second electrical currents, at least one adjustment element modifying the quantum efficiency of a corresponding photodiode.

BRIEF DESCRIPTION OF THE DRAWINGS

The features and advantages of the invention will appear upon reading the following description, given only as an example, but not limited to, and making reference to the enclosed drawings, wherein.

DETAILED DESCRIPTION

Figure 1:
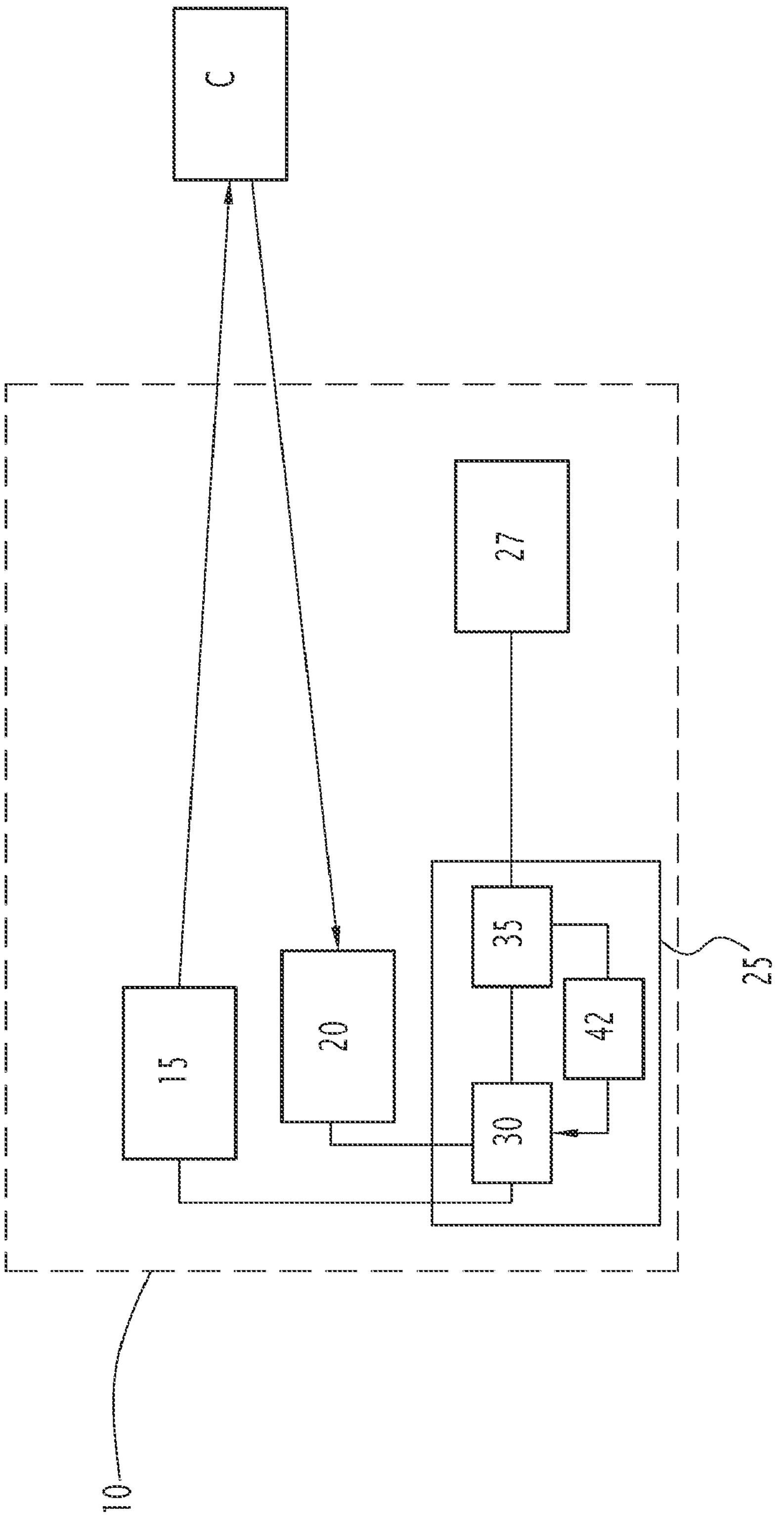
FIG. 1 is a partial schematic perspective representation of a first embodiment of a first example of lidar, including a conversion device according to the invention.

A first example of lidar 10 is partially represented in FIG. 1.

The lidar 10 is e.g. taken on-board a mobile platform such as a vehicle, in particular in an aircraft such as an airplane or a helicopter, or in a satellite.

In a variant, the lidar 10 is taken on-board a land vehicle, or attached to a fixed structure such as a building.

The lidar 10 comprises a transmission stage 15, a reception stage 20, a conversion device 25 and an analysis device 27.

The transmission stage 15 is, in a manner known per se, configured for transmitting a first signal towards a target C. Also, in a manner known per se, the transmission stage 15 and the reception stage 20 can share certain equipment components, e.g. a possible device for the orientation of the transmitted and/or received signal.

The first signal is a photonic signal. "Photonic signal" refers to a signal including an electromagnetic wave the wavelength of which in a vacuum lies e.g. between 100 nm and 20 μm.

More particularly, the transmission stage 15 is configured for modifying the wavelength of the transmitted signal over time. In such case, the lidar 10 is a lidar is a FMCW lidar.

For example, the transmission stage 15 is configured for modifying the wavelength of the photonic signal such that the time frequency associated with the wavelength varies according to a piecewise continuous time function According to one embodiment, the function is a periodic function, wherein the frequency increases or decreases linearly with time over a time range repeated periodically in time.

The time ranges are e.g. periodically repeated with a frequency comprised between 1 microsecond (μs) and 1 millisecond (ms).

The target C is apt to scatter the first signal transmitted by the transmission stage 15. The target C is either moving or stationary.

The transmission stage 15 is further configured for injecting a part of the signal transmitted into the conversion device 25.

For example, the transmission stage 15 includes a light source, such as a laser, configured for transmitting the first signal and is configured for splitting off a part of the light emitted by the light source and for directing said part to the conversion device 25. The split-off part of the signal generally depends on the power of the laser signal, and there can be systems where the power of the split-off part corresponds to approximately 1% of the power of the emitted laser signal.

The reception stage 20 is configured for receiving a second photonic signal. The second photonic signal is the signal scattered by the target C when the target C is illuminated with the first signal. Since the target C is distant from the lidar 10, the second signal has a frequency different from the frequency of the first signal, the difference between the two frequencies being a function of the distance between the lidar 10 and the target C.

The reception stage 20 is further configured for directing the second photonic signal received to the conversion device 25.

Figure 2:
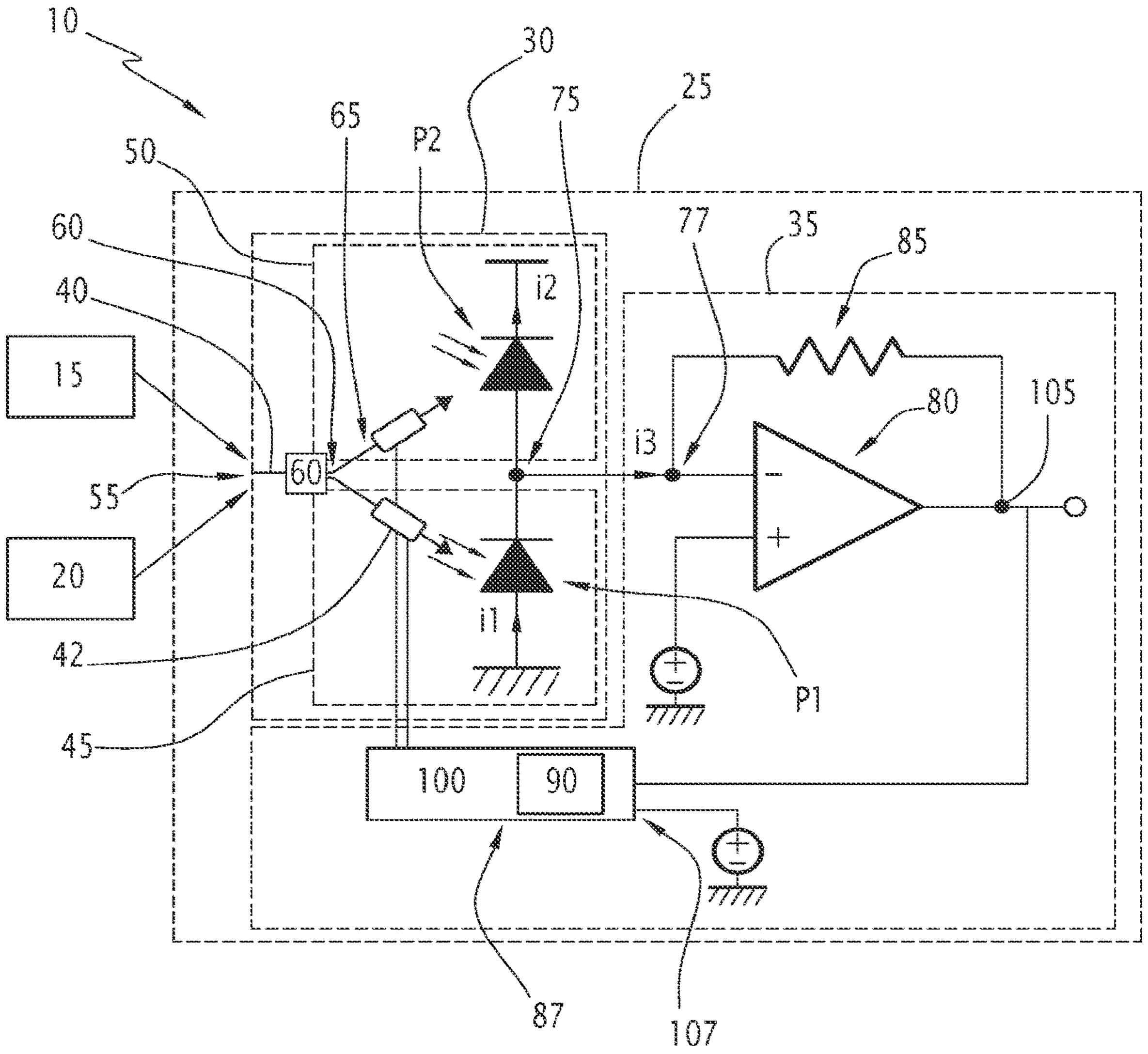
FIG. 2 is a more detailed representation of the lidar shown in FIG. 1, and in particular of the conversion device.

The conversion device 25, shown in greater detail in FIG. 2, is configured for converting a third photonic signal into a voltage. The third photonic signal is formed by the mixing of the second signal and of the part of the first signal which is transmitted to the conversion device 25, as will become clear hereinafter.

More particularly, the conversion device is configured for generating at the output thereof, an electrical voltage which will be analyzed by the analysis device 27 in order to calculate values of at least one parameter from the third signal.

Each parameter is e.g. chosen from the group consisting of: a distance between the target C and the lidar 10, a relative speed of the target C with respect to the lidar 10, an albedo value of the target C (by analyzing, in particular, the amplitude of the signal). It should be noted that if the third photonic signal were converted into an electrical signal by means of a photodiode, the corresponding electrical signal would include a DC part and an AC part. The third photonic signal is essentially an alternating signal and does not include, strictly speaking, a DC part. The DC part of a corresponding electrical signal is in practice an image of the "effective" energy conveyed by the photonic signal. Thereafter, to simplify the language, we will use the expression DC part of a photonic signal to refer to a DC component of a corresponding electrical signal which would be generated by a photodiode receiving the photonic signal. Similarly, we will use the expression AC part of a photonic signal to refer to an AC component of a corresponding electrical signal which would be generated by a photodiode receiving the photonic signal.

The third signal has a variable part and a continuous part, in particular during the transmission of the first signal.

The variable part has an optical power which varies over time. In particular, the variable part results from the mixing of the signals received from the transmitting stage 15 and the reception stage 20 and has a beat frequency caused by the difference between the frequencies of the first signal and of the second signal. It is the subsequent analysis of the beat frequency which is used for deducing, in a known way, the distance between the target C and the lidar 10.

The photonic power of a photonic signal is defined as the energy received per unit of time by a surface illuminated with the photonic signal.

The conversion device 25 includes a conversion element 30 which includes the elements used for changing from a photonic flux to an electrical current, a processing device 35 and at least one adjustment element 42.

The conversion element 30 includes an input branch 40, a splitter 60, and a pair of output branches 45, 50, the pair including a first output branch 45 and a second output branch 50.

The input branch 40 is configured for receiving the third signal and bring same to the splitter 60.

The splitter 60 is configured for conducting a first part of the third signal received to the first output branch 45 and to lead a second part of the third signal to the second output branch 50.

For example, the input branch 40 has an end 55 wherein the photonic flux of the third signal arrives, the flux being guided to the splitter 60 by the main branch 40.

As is known to a person skilled in the art, it will be noted that it is possible to use a splitter 60 with two inputs for receiving the signals to be mixed coming from the transmission stage 15 and the reception stage 20, the mixing being carried out inside the splitter 60, before or during the actual operations of separation and phase shifting.

According to the embodiments shown in the figures, the conversion element 30 includes a single first branch 45 and a single second branch 50; however, it should be noted that it is possible to have a plurality of pairs of branches, as will be specified infra.

In a manner known per se, the conversion element 30, and in particular the splitter 60, is configured for imposing a phase shift of approximately 180 degrees)(° between the first part and the second part of the third signal.

In particular, the expression "approximately 180°" refers to a phase shift comprised e.g. between 170° and 190°, more particularly between 175° and 185°

The conversion element 30 is configured for establishing a ratio between the power of the first part and the power of the second part.

The conversion element 30 is e.g. configured so that the power of the first part and the power of the second part are equal to each other, within 5 percent (%), or even within 2%.

Each first or second output branch 45, 50 is further configured for generating, by means of a corresponding photodiode P1 or P2, respectively, an electrical current i1 or i2 in response to the reception of the first or second corresponding parts of the third signal. Thereafter, the current generated by the output branch 45 will be referred to as i1 and the current generated by the output branch 50 will be referred to i2.

More particularly, the value of each electrical current i1 or i2 is a function of the optical power of the first or second part of the third signal received by the first or second output branch 45, 50 considered.

Each of the first output branch 45 and of the second output branch 50 includes a waveguide portion 65 and a photodiode P1, P2. The first output branch 45 comprises a first photodiode P1, and the second output branch 50 comprises a second photodiode P2.

The waveguide portion 65 of the first output branch 45 is configured for receiving the first part of the third signal and for illuminating the photodiode P1. The waveguide portion 65 of the second output branch 50 is configured for receiving the second part of the third signal and for illuminating the photodiode P2.

The waveguide portions 65 of the output branches 45 and 50 are connected to the input branch 40 by the splitter 60 which performs a separation and a respective phase shift. Such a splitter device 60 corresponds e.g. to a multi-mode interferometer (MMI).

For each first or second output branch 45, 50, a photon transmittance is defined as equal to a ratio between, in the numerator, the optical power of the first or second part of the third signal output at the of the waveguide portion 65 and, in the denominator, the optical power of the first or second part of the third signal at the input of the waveguide portion 65.

In other words, the photonic transmittance of a first or second output branch 45, 50 is a ratio between, in the denominator, the optical power of the signal injected by the main branch into the first or second output branch 45, 50 and, in the numerator, the optical power of the signal illuminating the photodiode P1, P2 of the first or second output branch 45, 50 considered.

Each photodiode P1 or P2 is configured for generating the electrical current i1 or i2 when illuminated with the first or second part, respectively, of the third signal.

A quantum efficiency is defined for each photodiode P1, P2.

The quantum efficiency of each photodiode P1, P2 is defined as being equal to a ratio between, in the numerator, the number of charge carriers generated per unit of time and, in the denominator, the number of photons illuminating the photodiode during the same unit of time.

Each photodiode P1, P2 has an anode and a cathode. The electrical current i1 or i2 generated by the photodiode P1, P2 flows through the photodiode, and we consider a positive arbitrary direction when the current flows from the anode to the cathode.

The conversion device 25 is configured for imposing a difference of potential between the anode and the cathode of each photodiode P1, P2.

In the first example of lidar 10, the photodiodes P1, P2 of the two branches are connected in series in the same direction with each other. In such case, the conversion device 25 is e.g. configured for imposing an electrical voltage between two ends of a series electrical circuit including the two photodiodes P1, P2.

More particularly, a portion of electrical circuit is connected to the anode of one of the photodiodes (photodiode P2) and to the cathode of the other photodiode (photodiode P1).

In the first example of a device, the portion of electrical circuit is e.g. an electrical conductor connecting the anode of the photodiode P2 to the cathode of the photodiode P1.

A point 75 is defined, referred to hereinafter as the "midpoint", of said portion of the electrical circuit.

In said example, the cathode of the photodiode P1 is connected to the point 75, the electrical potential of which is regulated. The anode of the photodiode P1 is e.g. connected to ground, as shown in FIG. 2

A terminal of a voltage source Vdd is connected to the cathode of the photodiode P2, the anode thereof being connected to the midpoint 75.

The processing device 35 is configured for receiving a current i3 as input.

In the example shown in FIG. 2, according to Kirchoff's circuit law, the current i3 is equal to the current i2 minus the current i1.

The processing device 35 is configured for amplifying the current i3 and for generating an electrical output signal, the electrical output signal being a function of the value of the current i3.

For example, the electrical voltage of the output electrical signal is proportional to the value of the current i3, and thus to the difference between the values of the currents i1 and i2.

Thereby, in the absence of saturation or of other non-linearities of the processing device 35, the variable part of the electrical voltage of the output electrical signal varies linearly as a function of the optical power of the variable part of the third signal.

A gain is defined for each first or second output branch 45, 50. The gain is the coefficient of proportionality between the value of the electrical current i1 or i2 associated with a branch 45 or 50 and the optical power of the part of the third signal injected into the branch considered.

In other words, the value I of the electrical current i1 or i2 generated is related to the optical power P of the corresponding signal by the following equation:

$$I=a+P+b. \quad \text{[Math 1]}$$

where a is a constant, b is a real number, and * represents the multiplication operation.

The constant a is then the coefficient of proportionality between I and P, or "branch gain".

It should be noted that the term "coefficient of proportionality" is used herein for representing any coefficient relating the variation of one quantity to the variation of another quantity, independently of the value of the number b. It should be noted that the number b is in practice negligible compared with the term a*P when the optical power P is significant and in particular lies within a range of variations of the input power of the third signal considered in the present invention. Thereby, hereinafter in the explanations, it can be considered that the electrical current supplied by a photodiode is proportional to the optical power P.

The processing device 35 includes an input 77, an amplifier 80, a resistive dipole 85 and a regulation loop 87 including a filter 90 and a controller 100.

The processing device 35 is an electronic device, i.e. a device configured for processing and/or generating data, messages or controls in the form of electrical signals.

For example, the input 77, the amplifier 80, the resistive dipole 85 and the regulation loop 87 are at least partially formed by one or more electrical circuits, supported by one or a plurality of printed circuit boards or any other functionalizable support. The electrical circuit(s) can be e.g integrated circuits produced by the CMOS technology, connected and powered, if appropriate, via a semiconductor interposer or an equivalent means.

Alternatively or additionally, the processing device 35 includes a data processing unit, which can comprise a processor and a memory containing software instructions intended for being processed by the processor. The processor can be used, if appropriate, for producing all or part of the filter 90 and/or of the controller 100.

The input 77 is configured for receiving the electrical current i3.

For example, the input 77 is electrically connected to the midpoint 75.

The amplifier 80 is an "operational amplifier".

The amplifier 80 has a non-inverting (+) input, an inverting (−) input and an output 105.

The output 105 is single in the first example of the conversion device 25. Such amplifier architectures 80 are frequently referred to as "single output differential amplifier".

The amplifier 80 is configured for generating the electrical output signal. More particularly, the amplifier 80 is configured for modifying the electrical voltage between the output 105 and an electrical potential reference, such as a grounding terminal of the amplifier 80, as a function of the current i3.

The non-inverting (+) input is connected to a point, the electrical potential of which is substantially constant, the value of which is chosen in particular as a function of the assembly formed by the photodiodes P1, P2.

However, the electrical potential of the non-inverting (+) input can be different from one conversion device 25 to another, depending in particular, on the electrical power supplies of the amplifier. For example, if the amplifier 80 is supplied between two distinct electrical potentials on the supply pins thereof, the electrical potential of the non-inverting (+) input is e.g. equal to, or close to, the average of the two electrical potentials of the pins.

In the case where the electrical power supplies are biased with electrical potentials of opposite signs and of the same absolute value, the electrical potential of the non-inverting (+) input is e.g. the electrical potential of ground.

The inverting (−) input is connected to the input 77 of the processing device. In particular, the inverting (−) input is connected to the input 77 in such a way that same has an electrical potential identical to the potential of the midpoint 75.

The resistive dipole 85 is electrically connected, at one of the terminals thereof, to the output 105 of the amplifier 80 and, at the other of the terminals thereof, to the input 77. Thereby, since the current entering the inverting (−) input of the amplifier 80 is zero, the current flowing between the output 105 of the amplifier 80 and the input 77 is equal, in value, to the current i3.

The electrical potential of the input 77 and of the midpoint 75 is thus maintained by the amplifier 80, via the modification of the potential of the output 105.

The resistive dipole 85 has an electrical resistance value comprised e.g. between 1 kiloOhm (kΩ) and 1 megohm (MΩ).

The assembly formed by the amplifier 80 and the resistive dipole 85 connected between the output 105 and the inverting (−) input of the amplifier 80, is sometimes called "resistive transimpedance amplifier" (RTIA).

The regulation loop 87 is configured for acting on at least one adjustment element 42 depending on the value of the voltage at the output of the amplifier 80.

The regulation loop 87 can be either analog or a digital or further, a regulation loop.

When the regulation loop 87 is a digital loop, same comprises e.g. an analog-to-digital converter interposed in-between the output 105 and the filter 90.

It should be noted that, although the filter 90 and the controller 100 are described herein as distinct devices, embodiments wherein a single device has the functions of the two elements can also be envisaged.

The filter 90 is connected to the output 105 of the amplifier 80 and is configured for generating a filtered signal from the electrical output signal.

The filter 90 is a low-pass filter for frequency.

The filter 90 has e.g. a cut-off frequency comprised between 1 kilohertz (kHz) and 10 megahertz (MHz). However, it should be noted that the cut-off frequency of the filter 90 should be suited to the frequency range of the effective signal AC which is desired to be recovered at the output of the amplifier The filter 90 has a transfer function.

The transfer function is e.g. the function of an active PI filter comprising an integral part and a proportional part.

The regulation loop 87 compares the received output signal with a setpoint value, so as to define an error value, and generates a control from the control unit 100 taking the error into account. The filter 90 is present in the regulation loop before and/or after the error has been defined. Furthermore, although the filter 90 is presented distinctly from the control circuit 100, the filtering function can be co-integrated with the control function and distributed across different constituent elements of the regulation loop. It is important for the regulation loop 87 to have a low-pass filter function in order to be able to eliminate the low-frequency component of the signal 105 at the output of the amplifier 80, the low-frequency component being subsequently called "DC" component as opposed to the "AC" component of the effective signal.

The aforementioned setpoint value can correspond e.g. to the desired value for the time average of the output voltage 105.

The setpoint value is e.g. equal to the electrical potential of the non-inverting (+) input. Such choice generally makes a maximum swing of the effective signal AC possible at the output of the amplifier before saturation.

The different values of the coefficients of the transfer function, as well as the setpoint value, are likely to vary or to be chosen according to the specific features of the lidar 10 considered.

The controller 100 is configured for determining, among the output branches 45, 50, which branch has the highest gain and for controlling the adjustment element or elements 42 accordingly.

For example, the regulation loop 87 has an integrator part in the transfer function of the filter 90. The values of the filtered signal tend, in the presence of an imbalance between the currents i1 and i2, to split-off along a direction (i.e. increasing or decreasing) depending on the direction of the imbalance. The controller 100 compares each value of the acquired filtered signal to a minimum threshold and a maximum threshold and determines which branch 45 or 50 has the highest gain when one of the values is less than or equal to the minimum threshold or greater than or equal to the maximum threshold.

When the lidar is initialized, the adjustment elements 42 are controlled with a predefined initialization voltage and the output of the integrator part is reinitialized to a reference voltage (equal in the present example to the regulation voltage of the node 77). No immediate overshoot of the minimum and maximum thresholds is detected, and consequently the controls of the adjustment elements 42 remain unchanged.

After a certain time, the output of the integrator part will split-off along one direction according to the imbalance of the currents, and a minimum or maximum threshold will be crossed, resulting, in turn, in the modification of the control signal of an adjustment element 42 along the direction of a rebalancing of the currents in order to obtain the largest possible currents i1 and i2.

If balance is found, the output of the integrator part normally remains stable and hence the controls of the adjustment elements no longer change. If an imbalance is established over time, e.g. due to temperature variations, or to a lidar problem (object too close to lidar in a non-transient way) then the output of the integrator part will split-off again.

If the output of the integrator part reaches a minimum or a maximum saturation voltage which no longer makes it possible to correct the unbalance, then it is possible to modify the control of the other adjustment element 42 which was previously unchanged, for finding a voltage at the output of the unsaturated integrator part.

If the integrator part split-offs in an opposite way to the way previously observed, by exceeding another amongst the minimum and the maximum thresholds, it is then possible to modify the control action, by "inverting" same, so as to modify a control signal of another adjustment element 42 along the direction of a re-balancing of currents, always in order to preferentially have the largest possible currents i1 and i2.

The minimum threshold is e.g. equal to the potential of the node 77−0.5 V. The maximum threshold is e.g. equal to the potential of the node 77+0.5V.

Furthermore, according to a variant, one of the output branches 45, 50 generates by construction, an electrical current i1 o ri2 which is higher than the electrical current of the other output branch 45, 50. In such case, the controller 100 no longer needs to determine which branch 45 or 50 has the highest gain.

Such a regulation loop 87 can be implemented either in digital form or in analog form or in mixed analog-digital form.

Furthermore, the type of control signal used is also likely to vary, e.g. being an analog or a digital signal.

The controller 100 compares e.g. the filtered signal with a predefined setpoint value, and generates the control according to the comparison. The control has e.g. a voltage or a current proportional to a difference between the filtered signal and the setpoint value.

The setpoint value is e.g. a value such that the output of the amplifier 80, and hence the current i3, contain a negligible DC component after a time of establishment of the regulation loop 87. The setpoint value is e.g. equal to 1.65 V or to 0 V, depending on the power supply of the amplifier 80 and preferentially corresponds to the regulated voltage level of the midpoint 75. In practice, in such example, the setpoint value is supplied by a setpoint value generator 107.

Depending on a natural variant for a person skilled in the art, and as is the case in other embodiments infra the operation of comparison with a predefined desired setpoint value can be carried out before the filtering operation, e.g. directly on the output signal 105.

Furthermore, the controller 100 is configured for generating at least one control based on the filtered signal and for transmitting each control to the adjustment element 42 for which the control is intended. Each control is e.g. a control for modifying the gain, or else a control for maintaining the gain at a constant value, as will be become clear hereinafter.

Each control is, in particular, an electrical signal such as an electrical voltage.

It should be noted that the type of control, the method used for generating the control and the characteristics thereof are likely to be adapted by a person skilled in the art depending on the situation, in particular depending on the type of adjustment element 42 used.

According to the embodiment shown in FIG. 2, the conversion device 25 includes two adjustment elements 42, one for each output branch 45, 50. However, according to possible variants, the conversion device 25 includes a single adjustment element 42 associated e.g. with only one of the output branches 45, 50.

Each adjustment element 42 is configured for modifying the gain of the corresponding first or second output branch 45, 50.

According to the embodiment shown in FIG. 2, each adjustment element 42 is configured for modifying the photonic transmittance of the corresponding first or second output branch 45, 50.

For example, each adjustment element 42 is an attenuator, configured for absorbing a part of the photonic signal propagating in the corresponding waveguide portion 65, or an amplifier configured for increasing the optical power of the photonic signal propagating in the corresponding waveguide portion 65.

Electronically controllable attenuators for modifying the attenuation of a photonic signal in an optical waveguide are used in many applications such as telecommunications. Such attenuators include e.g. a waveguide portion wherein, via a p-n junction, the attenuator being provided for modifying a density of free charge carriers by volume, the attenuation of the signal depending on the density of charge carriers present. Thereby, a control received by the attenuator, for modifying the free charge carrier density, results in a variation of the photonic transmittance in the waveguide.

The analysis device 27 is, in a manner known per se, configured for calculating parameters of the target C, e.g. a distance between the target C and the lidar 10 and/or a relative velocity of the target C with respect to the lidar 10, depending on the electrical output signal. For example, the analysis device 27 is electrically connected to the output 105 of the amplifier 80.

Figure 3:
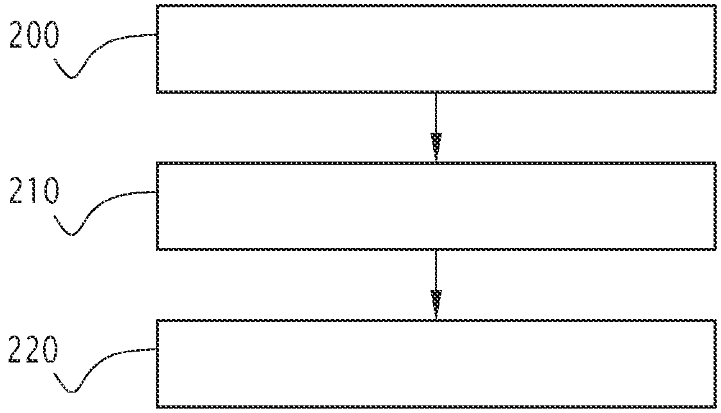
FIG. 3 is a flowchart of the steps of a control method for the conversion device as shown in FIG. 1.

The operation of the lidar 10 will now be described with reference to FIG. 3, which presents a flow chart of the steps of a control method for the conversion device 25.

The control method includes a filtering step 200, a generation step 210 and a transmission and modification step 220.

During steps 200 to 220, the first photonic signal and the second photonic signal are generated by the transmission stage 15 and by the reception stage 20, respectively.

The third signal propagating in the input branch 40 is then the mixture of a part of the first photonic signal emitted towards the target C and of the second photonic signal scattered by the target C.

The third signal is divided in the conversion element 30 into a first part circulating in the first output branch 45 and a second part circulating in the second output branch 50. The illumination of each of the photodiodes P1, P2 with one of the first and second parts of the third signal thus leads to the generation, by each photodiode P1, P2, of the corresponding electrical current i1 or i2.

Each electrical current i1 or i2 includes a variable part and a continuous part, the currents depending on the first or second part, respectively, of the third signal which caused the generation of the electrical current i1 or i2 considered.

An electrical current i3 having a value equal to the difference between the values of the electrical currents i1 and i2 flows between the midpoint 75 and the input 77 of the processing device 35.

If the third signal were also divided by the waveguide 35 between the first output branch 45 and the second output branch 50, and if the two photodiodes P1 and P2 were strictly identical, the DC parts of the two currents i1 and i2 would be equal to each other.

Since a phase shift close to 180° is imposed between the first and second parts of the third signal, the variable parts of the first electrical currents are also 180° out of phase with respect to each other. Also, if the third signal were divided equally by the waveguide 35 between the first output branch 45 and the second output branch 50 and if the two photodiodes P1, P2 were strictly identical, the variable parts of the electrical currents i1 and i2 would be the inverse of each other.

Thereby, in an ideal case where the third signal was divided equally by the splitter 60 between the first output branch 45 and the second output branch 50 and if the two photodiodes P1, P2 were strictly identical, the current i3 flowing between the midpoint 75 and the input 77, corresponding to the difference between the currents i1 and i2, would have no DC component and would be a purely variable current, the value of which would be twice the value of the variable part of each of the currents i1 and i2.

The output signal of the amplifier 80, in particular the electrical voltage between the output 105 and an electrical reference point, would then be a variable signal without any DC component, resulting from the amplification of the electrical current i3 received at the input 77.

However, the splitter 60 is never perfect.

When the third signal is divided unevenly by the splitter 60 between the first output branch 45 and the second output branch 50, or when the quantum efficiency of one photodiode P1, P2 differs from the quantum efficiency of the other photodiode P1, P2, the DC parts of the two currents i1 and i2 are not equal, and a DC component thus subsists in the electrical current i3 received at the input 77.

Therefore, the electrical output signal generated by the amplifier 80 has, in addition to a variable part the analysis device 27 of which is configured for extracting information concerning the target C, a DC part resulting from the difference between the two currents i1 and i2.

During the filtering step 200, the filtered signal is generated by the filter 90 from the output signal. More particularly, since a DC part could be present in the output signal, the filtered signal includes at least one component corresponding to said DC part. For example, the filtered signal includes the DC part of the output signal.

During the generation step 210, the controller 100 generates a control intended for at least one adjustment element 42 from the filtered signal.

For example, the controller 100 generates a control addressed to each of the adjustment elements 42.

More particularly, when the adjustment elements 42 are attenuators, the controller 100 generates e.g. a control for reducing the gain (in practice, a gain less than 1 since an attenuator is concerned), addressed to the adjustment element 42 corresponding to the output branch 45, 50, the current i1 or i2 of which has the most intense DC component and a control for maintaining the gain unchanged, addressed to the control element 42 corresponding to the first or second output branch 45, 50, the current i1 or i2 of which has the least intense DC component.

In a variant, if the adjustment element 42 is an amplifier, the controller 100 generates a control for increasing the gain, addressed to the adjustment element 42 corresponding to the output branch 45, 50 the current i1 or i2 of which has the least intense DC component and a control for maintaining the gain unchanged, addressed to the control element 42 corresponding to the first or second output branch 45, 50, the current i1 or i2 of which has the most intense DC component.

If a respective control is generated for at least two adjustment elements 42, the controls are apt to cause different modifications, by means of said adjustment elements 42, of the gains of the output branches 45, 50 associated with the adjustment elements 42 considered.

According to another variant, a single control for increasing or decreasing the gain is sent to the destination, e.g. if only one adjustment element 42 is present.

Thereby, the gain of only one of the two, first or second output branches 45, 50 is modified.

During the step 220, the or each control is transmitted to the corresponding adjustment element 42. The adjustment element 42 then modifies the photonic transmittance, and hence the gain of the corresponding first or second output branch 45, 50.

The steps 200 to 220 are repeated until the DC component present in the current i3 is such that the control(s) generated by the controller 100 does/do not lead to any modification of the photonic transmittance of the output branches 45, 50, e.g. when each control generated is a control for maintaining the gain unchanged.

More particularly, the steps 200 to 220 are repeated continuously, so that the gains of the two output branches 45, 50 are substantially equal, so that the current i3 includes only a negligible or undetectable DC component.

In prior art devices, the waveguides used for conducting the photonic signal to be analyzed and for separating same into two parts, are necessarily imperfect and do not allow the photonic signal to be divided exactly into two equal parts, and the power of the signals illuminating the two photodiodes P1, P2 is thus generally slightly different from one photodiode P1, P2 to the other. Furthermore, the efficiencies of the two photodiodes P1, P2 are likely to differ slightly from each other.

Due to such imperfections, the signal resulting from the subtraction of the currents of the two photodiodes P1, P2, which should ideally comprise only a variable part depending on the difference in frequency between the received and the emitted photonic signals, generally includes a non-negligible DC component.

When the variable part of the signal to be analyzed is very small, e.g. when the target C is very far from the lidar, the DC component is likely to be much larger than the variable part. As a result, the capacity of the conversion device to analyze signals, the variable part of which is very small, is limited by the presence of the DC component, since the chain is likely to be saturated by the DC component of the electrical signal whereas the variable component remains below the level required for analyzing the variable component.

According to the invention, the regulation loop 87 acting on the adjustment element(s) 42 can be used for very significantly reducing the DC component resulting, in the current i3, from the imperfection of the conversion element 30. Also, the amplifier 80 can be chosen for very strongly amplifying the variable component containing the information sought, without the subsisting DC component saturating the amplifier 80. It is then possible to precisely analyze the variable component of the current i3 even with a second very weak signal coming from a distant target C or where there is little scattering of the first photonic signal.

Furthermore, since one or a plurality of gains are modified in order to achieve such result, a modification of the power of the first and second signals (modification which may result from a variation e.g. of the photonic power of the first signal transmitted) does not require the control method to be repeated. In this respect, the method is more precise and faster than a method which would compensate the current $i3_{DC}$ by injecting an additional electrical current (or by subtracting a current) at the output of the diode bridge P1, P2 and would thus perform a so-called "offset" correction, since the value of the additional electrical current should be adapted to each modification of the value of the first and second signals.

More particularly, the regulation makes it possible to cancel the DC component in the current i3 according to the equation:

$$i3_{DC}=i1_{DC}-i2_{DC}=0 \quad \text{[Math 2]}$$

Wherein $\mathbf{i3}_{DC}$ is the value of the DC component of i3, $\mathbf{i2}_{DC}$ is the value of the DC component of i2, and $\mathbf{i1}_{DC}$ is the value of the DC component of i1.

The gain correction according to the invention amounts to acting on one or the gain(s) of the branches 45 and 50 in order to satisfy the equation:

$$i3_{DC}=A1\times QE_1\times P_{1DC}-A2\times QE_2\times P_{2DC}=0 \quad \text{[Math 3]}$$

wherein A1 is the gain of the branch 45, $QE_1$ is the quantum efficiency of the photodiode P1, $P_{1DC}$ is the power of the continuous part of the photonic signal entering the branch 45, A2 is the gain of the branch 45, $QE_2$ is the quantum efficiency of the photodiode P2, and $P_{2DC}$ is the power of the continuous part of the photonic signal entering the branch 50.

Since $P_{1DC}$ and $P_{2DC}$ are proportional to the strength of the power of the third signal (i.e. the total signal entering the conversion element 30) and the coefficient of proportionality is set by construction, it is not necessary to change A1 or A2 if the strength of the third signal varies.

On the other hand, an "offset" regulation, as proposed in the prior art, amounts to adding a current $I_{fb}$ according to the equation:

$$i3_{DC}=QE_1\times P_{1DC}-QE_2\times P_{2DC}-i_{fb}=0 \quad \text{[Math 4]}$$

It results therefrom that, in the case of an "offset" correction, if the value of the photonic signal injected into the conversion element 30 (and thus the value of $P_{1DC}$ and $P_{2DC}$) varies, the value of the current $i_{fb}$ needs to be adjusted. In the event of a rapid variation in the value of the signal, a lidar using an offset correction thus may saturate for a certain period (until $I_{fb}$ has been adjusted), which is not the case for the lidar 10 according to the invention.

The photonic transmittances of waveguides can be modified in a precise manner and thus lead to an even more precise adjustment of the gain of each output branch 45, 50. The use of one or a plurality of adjustment elements 42 acting on said parameter thus increase the precision or extend the operation range of the process.

Since the midpoint 75 is directly connected to an input, in the present case the (–) input, of the amplifier 80, the processing device 35 can evaluate the DC component subsisting in the output signal and thus regulate the adjustment element or elements 42 so as to cancel or at least limit the DC component in a controlled manner.

It should be noted that circuits wherein the midpoint 75 would be electrically decoupled from the amplifier 80, e.g. by a capacitor interposed between the input of the amplifier 80 and the midpoint, are not compatible with the control method described, insofar as the processing device would no longer have access to the DC component at the output of the amplifier, since same would be filtered upstream, at least in part, by the interposed capacitor, and thus could not regulate same as explained hereinabove. Furthermore, since the electrical potential of the midpoint of such assemblies is not set by the amplifier 80, it is necessary to initialize the amplifier 80 at the beginning of each time range of observation of the signal, in order to reinitialize the electrical potential reference values used by the amplifier 80.

On the other hand, in a device according to the invention, once the regulation loop has been set, it is not necessary to provide for an initialization time for the output of the amplifier 80 before making an evaluation of distance. Indeed, the regulation loop has a slow, even very slow, adjustment time, compared to an evaluation time (a frequency ramp of a radar measurement). Thereby, for a present evaluation, the control of the adjustment elements 42 is predominantly defined by the behavior of the system during past evaluations. Therefore, the conversion device 25 according to the invention leads to greater precision in the measurement of parameters of the target C than assemblies wherein the midpoint 75 would be electrically decoupled from the amplifier 80 due to the absence of initialization time. Another advantage of the invention is that it is possible to freely choose the transfer function of the regulation loop, which further makes it possible to reduce the dynamic range of the signal likely to be present at the input of the amplifier 80, thus facilitating the embodiment thereof.

It should be noted that in certain embodiments, the conversion device 25 can be integrated into a system other than a lidar, for analyzing photonic signals not resulting from the scattering of a signal by a target C.

Figure 4:
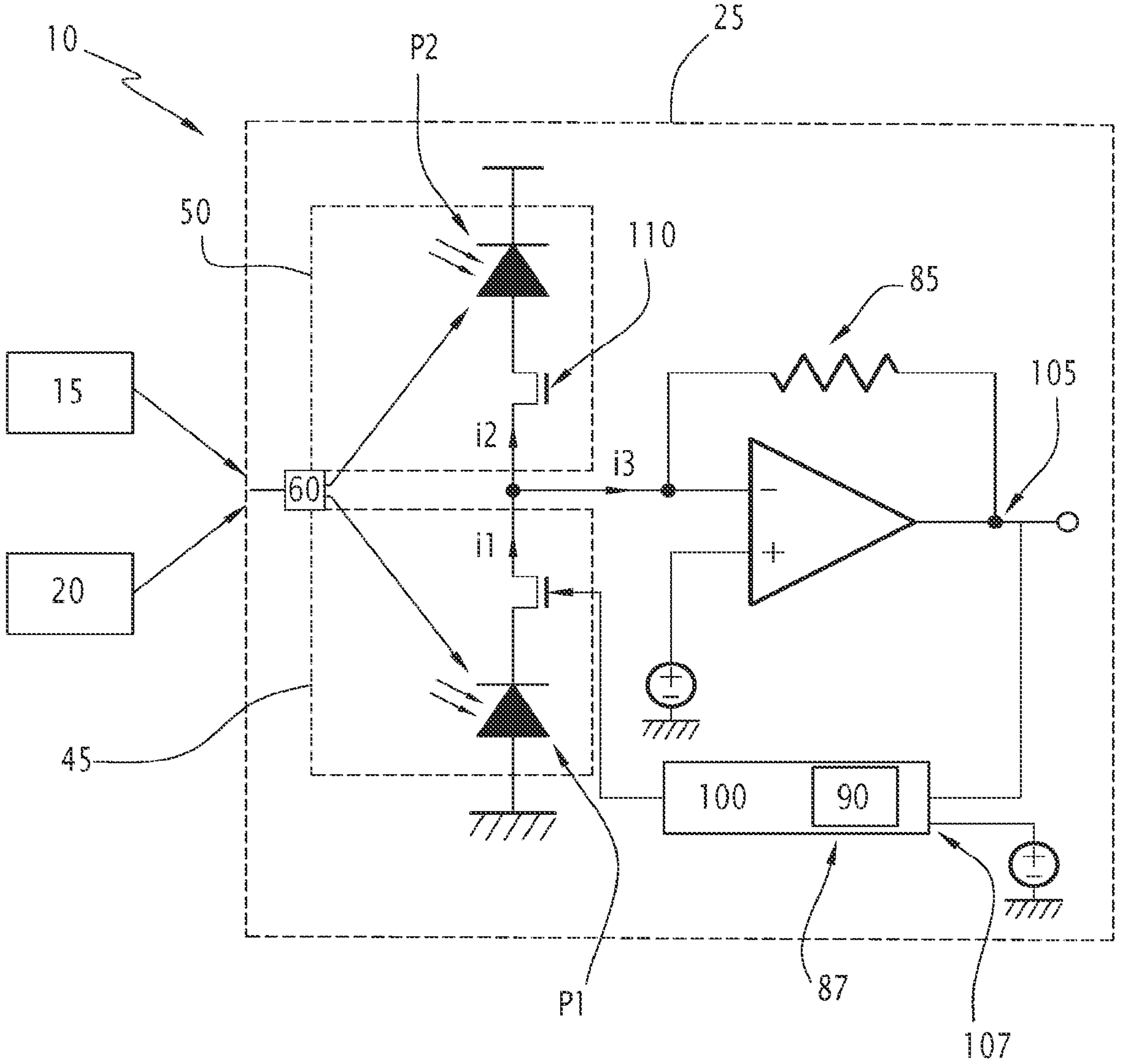
FIG. 4 is a partial schematic representation of a second example of lidar according to the invention.

A second example of lidar 10 according to the invention is shown in FIG. 4 and will now be described.

The elements identical to the first example of lidar 10 are not described again. Only the differences are highlighted.

Each adjustment element 42 is configured for modifying the quantum efficiency of a corresponding photodiode P1, P2.

For example, each adjustment element 42 is configured for modifying an electrical voltage between the anode and the cathode of the corresponding photodiode P1, P2. Many types of photodiodes P1, P2 have a quantum efficiency varying as a function of the voltage between the anode and the cathode of the photodiode P1, P2. Thereby, for the same photonic flux arriving at a photodiode, the current generated by the photodiode P1, P2 varies as a function of the voltage between anode and cathode, over a range of voltages leading to a modification of the quantum efficiency.

Each adjustment element 42 includes e.g. a transistor 110 connected in series with the corresponding photodiode P1, P2.

Each transistor 110 is e.g. a field effect transistor including a gate, a drain and a source, the conductance between the drain and the source being a function of an electrical voltage between the gate and the source. Under saturation, such a field effect transistor can be used for modifying the source voltage by modifying the gate voltage.

Each transistor 110 is e.g. connected in series between the corresponding photodiode P1, P2 and the midpoint 75. More particularly, the transistor 110 is configured for leading the current i1 or i2 between the anode or the cathode of the photodiode P1, P2 and the midpoint 75.

In such case, the transistor 110 belongs to the aforementioned portion of electrical circuit, which consisted, in the first example, of a single conductor.

Thereby, because the transistors 110 are connected as a voltage follower, or more precisely according to a configuration wherein same operate under saturation, a modification of the gate voltage of the transistor 110 leads to a modification of the electrical voltage of the source, which further leads to a variation in the electrical potential of the cathode or of the anode of each photodiode P1, P2 connected to the source of the corresponding transistor 110.

Indeed, the electrical potential of the midpoint 75, which is connected to one of the inputs of the amplifier 80, is substantially fixed. Since, moreover, a fixed difference of potential is applied between the two ends of the series circuit containing the two photodiodes P1, P2, the transistor(s) 110 and the midpoint, when the gate voltage of one of the transistors 110 is modified, the voltage between the midpoint 75 and one of the ends of the series circuit is distributed differently between a transistor 110 and the photodiode P1, P2 in series, the drain-source voltage increasing when the voltage at the terminals of the photodiode P1, P2 decreases and vice versa.

The regulation loop 87 is configured for modifying the gate voltage of at least one of the transistors 110. For example, each control generated by the controller 100 during the step 210 is an electrical voltage applied to the gate of a corresponding transistor 110.

In the example shown in FIG. 4, two transistors 110 are present.

One of the transistors 110 is interposed between the cathode of the photodiode P1 of the first output branch 45 and the midpoint, the controller 100 being configured for modifying the gate voltage of the transistor 110.

The other transistor 110 is interposed between the midpoint 75 and the anode of the photodiode P2 of the second output branch 50. The processing device 35, or another electrical power supply source, is configured for imposing a set gate voltage on the transistor 110.

Thereby, the regulation loop 87 modifies the voltage at the terminals of one of the transistors 110 (corresponding to the first output branch 45) depending on the output signal of the amplifier 80, without the voltage at the terminals of the other transistor 110 being modified. Also, the voltage between cathode and anode, and hence the quantum efficiency, of the photodiode P1 of the first output branch 45 is modified by the regulation loop 87 without the quantum efficiency of the other photodiode P2 being modified. A modification of the gain of the first output branch 45 results therefrom, without the gain of the second output branch 50 being modified.

In this way, the regulation loop 87 controls the transistor 110 of the first output branch 45 in order to reduce the DC component in the current i3.

An advantage of the second example is that the adjustment element 42, consisting of one or a plurality of electronic components such as the transistor 110, is easy to produce together with the processing device 35, without requiring an additional electrical-optical element such as a photonic attenuator.

According to a variant, the regulation loop 87 of the second example is, like same of the first example, apt to modify the gains of each of the output branches 45, 50, in particular by modifying the gate voltages of one and/or the other of the two transistors 110.

In a variant, each transistor 110 is another type of transistor, e.g. a bipolar transistor including a base, an emitter and a collector, the conductance between the emitter and the collector being a function of an electrical voltage between the base and the emitter. A person skilled in the art would know how to adapt the second example shown in FIG. 4 to any type of transistor.

Furthermore, it should be noted that other methods for varying the voltage between the anode and the cathode of the photodiodes P1, P2 are likely to be used, e.g. by moving the transistor or transistors 110, or by using other devices for, e.g. varying the electrical potentials of the cathode of the branch 50 and/or of the anode of the branch 45.

Figure 5:
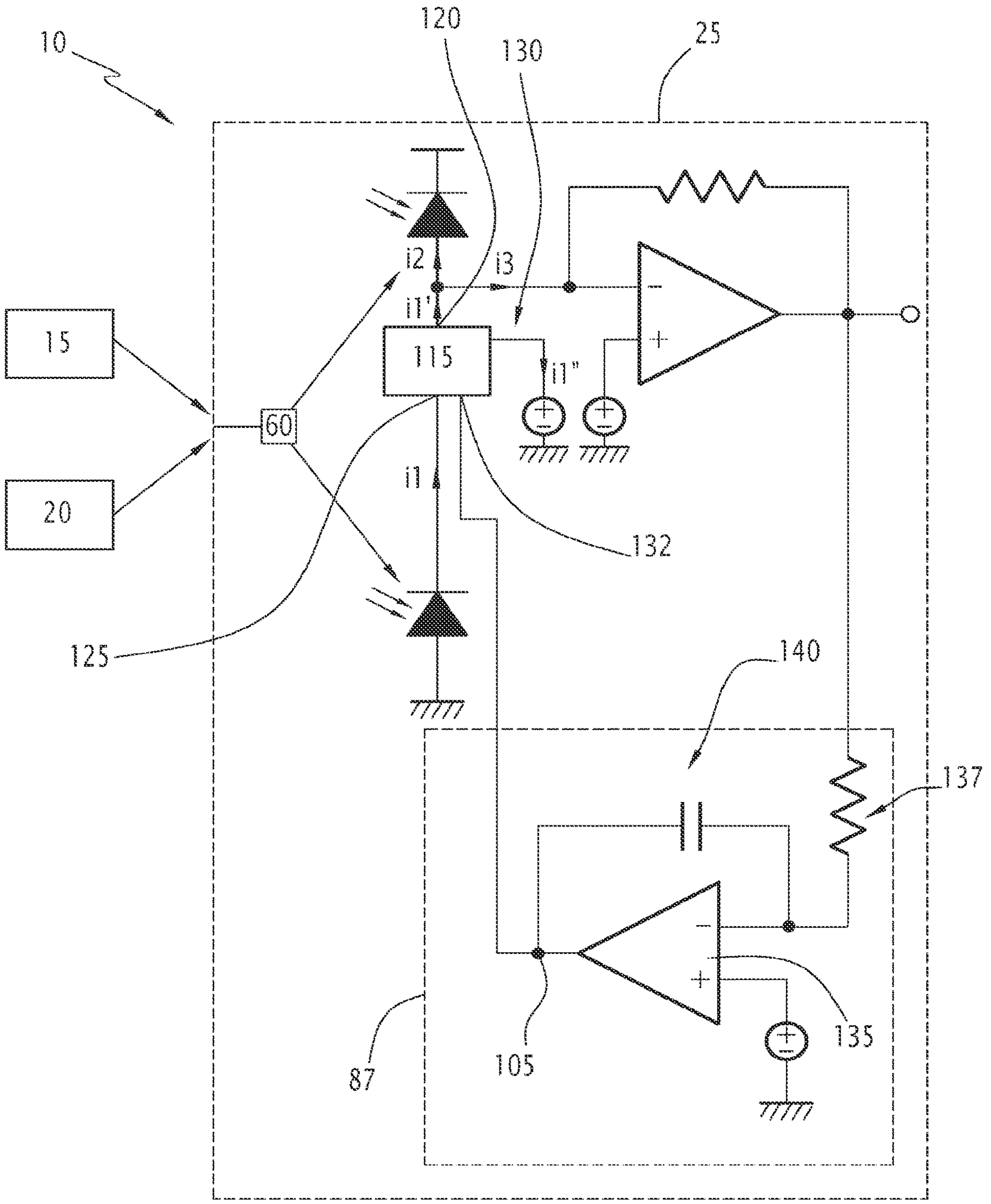
FIG. 5 is a partial schematic representation of a third example of lidar according to the invention.

A third example of lidar 10, shown in FIG. 5, will now be described. The elements identical to the first example are not described again. Only the differences are highlighted.

At least one adjustment element 42 includes a current splitter 115.

The current splitter 115 includes a first terminal 120, a second terminal 125, a third terminal 130 and a fourth terminal 132.

The current splitter 115 is configured for receiving the current i1 from the second terminal 125, and for making an electrical current i1', i1" flow through each of the first and third terminals 120, 130, respectively.

Each current i1', i1" is formed from the current i1. More particularly, the current i1 is the sum of the two currents i1' and i1".

In other words, the current splitter 115 is configured for splitting off a part i1" of the current i1 and for transmitting the other part i1' of the current i1 to the terminal 120.

Furthermore, the current splitter 115 is configured for modifying a ratio between the values of the currents i1' and i1" as a function of a control received, from the controller 100, by the current splitter 115 on the fourth terminal 132 thereof. More particularly, the current splitter 115 is configured so that said ratio is not very much modified or is very slightly modified by a variation in the value of the current i1.

In other words, the current splitter 115 is configured for modifying a coefficient of proportionality between the value of each current i1' and i1" and the value of the current i1, the sum of the two coefficients always being equal to one.

The control is e.g. an electric voltage value applied to the input 132 of the current splitter 115.

The first terminal 120 is electrically connected to the midpoint 75, and hence to the input 77 of the processing device 35.

The second terminal 125 is electrically connected to the cathode of the photodiode P1.

The third terminal 130 is electrically connected to a point having a fixed electrical potential, e.g. to ground or to the half of the power supply. More particularly, the third terminal 130 is electrically connected to a point having an electrical potential equal to the electrical potential of the midpoint 75. However, the electrical potential of the third terminal 130 is likely to vary from one embodiment to another.

The regulation loop 87 includes e.g. an amplifier 135, a resistive dipole 137 and a capacitor 140. The amplifier 135 includes, in a similar way to the amplifier 80, a non-inverting (+) input, an inverting (−) input and an output 105.

The non-inverting (+) input of the amplifier 135 is connected to a point of constant electrical potential, e.g. connected to ground.

The inverting (−) input of the amplifier 135 is connected to the outlet 105 of the amplifier 80.

The output 105 of the amplifier 135 is connected to the input 132 of the current splitter 115.

The resistive dipole 137 is connected in series between the output 105 of the amplifier 80 and the inverting (−) input of the amplifier 135.

An electrical resistance value of the resistive dipole 137 is comprised e.g. between 10 MΩ and 10 MΩ.

The capacitor 140 is connected between the inverting (−) input and the output 105 of the amplifier 135.

A capacitance value of the capacitor 140 is comprised e.g. between 100 femtofarad (fF) and 100 microfarad (uF).

The amplifier 135, the resistive dipole 137 and the capacitor 140 together form an integrator circuit having a low-pass filtering function.

It should be noted that many types of regulation loops 87 can be used, in particular analog or digital regulation loops 87 having transfer functions other than the function of a simple integrator.

The current splitter 115 includes e.g. a first transistor, the drain of which is connected to the terminal 130 and the source of which is connected to the terminal 125, and a second transistor, the drain of which is connected to the terminal 120 and the source of which is connected to the terminal 125.

The gate of the first transistor is e.g. configured for receiving a voltage delivered by the controller 100 (the voltage then forming the control issued by the controller 100) whereas a constant electrical potential is applied to the gate of the second transistor. In order to improve the accuracy of the current bypass control in the splitter 115, it is possible to provide a resistor between the source of the first transistor and the terminal 125.

The operation of the third example of lidar 10 shown in FIG. 5 will now be described.

When the two photodiodes P1, P2 are illuminated by the corresponding first or second part of the third signal, the two electrical currents i1 and i2 are generated.

The current it is transmitted by the cathode of the photodiode P1 to the second terminal 125.

A part i1' of the current i1 is transmitted by the current splitter 115 to the first terminal 120 and thus flows as far as the midpoint 75. Another part i1" of the current i1 is transmitted to the third terminal 130.

During the step 220, the electrical circuit formed by the amplifier 135, the resistive dipole 137 and the capacitor 140 filters the output signal and generates a voltage which is used as a control applied, e.g. directly to the input 132 of the current splitter 115.

The current splitter 115 then modifies the ratio between the values of the currents i1' and i1" according to the control received.

Thereby, the coefficient of proportionality between the value of the current i1' transmitted by the splitter 115 and the value of the current i1 is modified. A gain of the first output branch 45, defined as being a coefficient of proportionality between the value of the current i1' and the optical power of the signal received by the branch 45, is thus modified.

It should be noted that the third example involves splitting-off a part of the current i1 in order to modify the gain of the first output branch 45.

Such embodiment is thus particularly suited to a case where it is known beforehand, e.g. by construction, that the gain of one of the two branches is higher than the other in the absence of a current splitter 115 e.g. if a larger part of the photonic signal is transmitted to the first output branch 45 or if the efficiency of the photodiode P1 of the branch 45 is higher.

It will be clear for a person skilled in the art that the electrical circuit formed by the amplifier 135, the resistive dipole 137 and the capacitor 140 is only one example of a filter among many possible filters, which can be produced in both digital and analog form.

Obviously, the positioning of the current splitter 115 in the circuit is likely to vary, e.g. for split-offing a part of the current i2 instead of i1.

According to another variant, two current splitters 115 are present, one for each output branch 45, 50.

When a current splitter 115 is used for the branch 50, the first terminal 120 of the splitter 115 is connected to the anode of the photodiode P1, P2 of the branch 50, the third terminal 130 is connected to a voltage reference, e.g. the half of the power supply, and the second terminal 120 at the midpoint 75.

It should be noted that a conversion device including a current splitter is used in certain known lidars. Such lidars include a first photodiode receiving the signal received from the target C and delivering a current Is and a second photodiode receiving a part of the signal transmitted by the lidar and delivering a current Ir. A current splitter is used for split-offing a part of the current Ir before subtracting the remaining current Ir' from the current is generated by the first photodiode in an attempt to keep only the variable part therefrom. It is thus the difference between the current Is of the first photodiode and the current Ir' coming from the splitter which is transmitted to the amplifier of the conversion device.

Thereby, in such lidars, the purpose of the current splitter is to adapt the value of the current Ir (coming from the second diode) representative of the signal emitted by the lidar so that the DC part of the current Is generated by the first diode is eliminated by subtracting the current supplied by the splitter from the current of the first diode. Lidars including current splitters known from the prior art thus lack the conversion element 30 used in the present invention, and lack in particular the photonic splitter 60 for mixing the signal received from the target C with the signal emitted by the lidar before the mixed and phase-shifted signal is transmitted to the photodiodes. Such difference is important and makes it possible to overcome the drawbacks of the lidars, as explained hereinafter.

It should be noted that if the value of the optical signal returned by the target C varies, then the subtracted current component Ir' is no longer suitable, it is necessary in said prior art to modify the control of the splitter so as to adapt the value of the current Ir' supplied by the latter so that the value corresponds to the DC component (which is to be canceled) of the current Is which varies.

In circumstances where the value of the optical signal returned by the target C varies rapidly, e.g. due to consecutive measurements detecting objects at different distances, it may not be possible to adjust the splitter so rapidly, which leads to the appearance of a significant DC component in the signal transmitted to the amplifier and thus the saturation of the latter until the splitter is regulated.

On the other hand, in the assembly according to the invention, the multimode interferometer used in conjunction with the two photodiodes P1, P2 is used for automatically eliminating the DC component of the signal when the gains of the two branches 45 and 50 are equal. Even when the gains differ, the proportion of DC component in the current i3 depends only on the difference between the gains and not on the value of the signal scattered by the target C. Thereby, the assembly according to the invention leads to a more precise and faster conversion of the optical signal into an electrical signal since saturation periods during rapid variations in the value of the signal returned by the target C are prevented.

It should be noted that the different examples described hereinabove include amplifiers 80 using so-called "differential input, single output" architectures, where a single output is controlled according to the (+) and (−) inputs of the amplifier 80. However, so-called "fully differential" architectures are also likely to be used.

In such architectures, the amplifier has two separate outputs and controls a voltage difference between the two outputs as depending on the voltage difference between the two inputs thereof.

Figure 6:
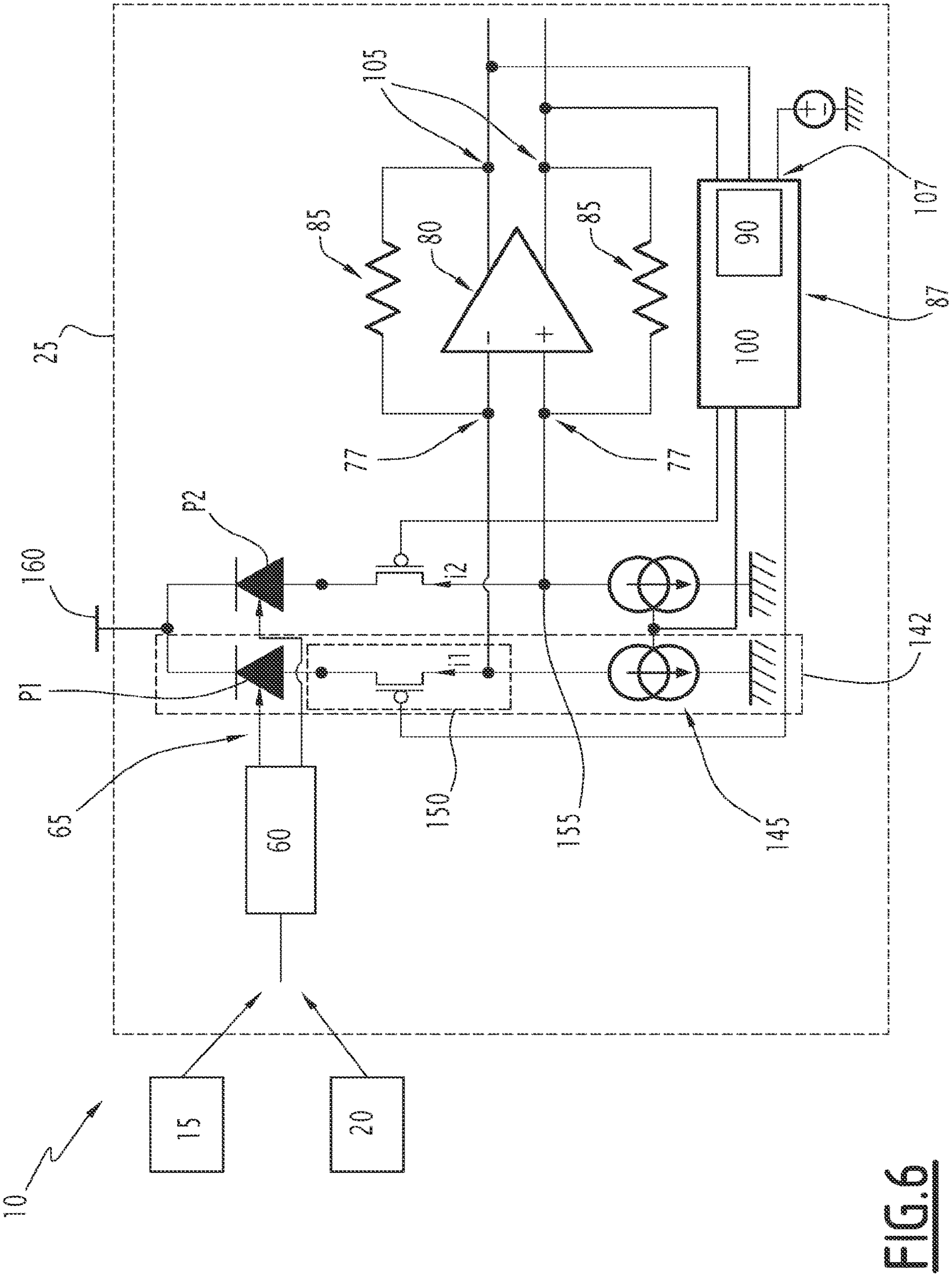
FIG. 6 is a partial schematic representation of a second example of lidar according to the invention.

A fourth example of lidar 10 is shown in FIG. 6.

The fourth example includes a differential architecture, each adjustment element 42 including a transistor 110 like in the second example.

The photodiodes P1, P2 are no longer connected in series like in the preceding examples.

For example, each output branch 45, 50 includes an electrical circuit 142 including successively, in series, a current generator 145, an electrical circuit portion 150 and a photodiode P1, P2.

Each current generator 145 includes a terminal connected to ground and a terminal connected to the electrical circuit portion 150.

The electrical circuit portion 150 connects the current generator 145 and the anode of the photodiode P1, P2. The electrical circuit portion 150 is configured for conducting an electrical current between the current generator 145 and the anode of the photodiode P1, P2.

Furthermore, each electrical circuit portion 150 is connected to a respective input 77 of the processing device 35, so as to allow the difference of current between the current generated by the photodiode P1, P2 and that generated by the generator 145 to be split-off towards to the input 77.

According to the embodiment shown in FIG. 6, the electrical circuit portion 150 comprises the transistor 110 in order to control the voltage across each photodiode P1, P2.

The cathode of each photodiode P1, P2 is electrically connected to a point 160 brought to a known electrical potential. For example, a voltage source is connected between ground and the point 160.

The point 160 is e.g. common to the two electrical circuits 142. Thereby, the two electrical circuits 142 are electrically connected in parallel with each other.

The amplifier 80 includes two separate outputs 105 and is configured for generating the output signal in the form of an electrical voltage between the two outputs 105.

Each of the non-inverting (+) input and of the inverting (−) input of the amplifier 80 is connected to one of the two electrical circuits 142. More particularly, each (+) or (−) input is connected to a point 155 of the corresponding electrical circuit portion 150. More particularly, each (+) and (−) input is directly connected to a point of the electrical circuit 142 interposed in-between the current generator 145 and the transistor 110.

For example, each (+) or (−) input is connected to the terminal of the current generator 145, or to the end of the portion 150 which is connected to the current generator 145.

The processing device 35 includes two distinct resistive dipoles 85 placed in-between an output and an input, respectively, of the amplifier.

The amplifier 80 is configured for modifying the electrical potential of each output 105 according to the value of the current received by the (+) or (−) input which is connected to a corresponding output 105 by a resistive dipole 85.

More particularly, the amplifier 80, the resistors 85 and the regulation loop enable the electrical potentials of the inputs 77 to be substantially equal to a predetermined value, e.g. a reference value applied to an input 107 of the assembly formed, herein by the filter 90 and the controller 100, the reference value being e.g. equal to half of the power supply.

The filter 90 is configured for generating a filtered signal from the difference in electrical potential between the two outputs 105.

The controller 100 is configured for generating, according to the filtered signal, a control signal for each adjustment element 42, according to a first regulation loop.

Furthermore, the controller 100 is configured for generating an identical adjustment signal intended for each current generator 145, the adjustment signal being suitable for controlling the modification of the value of the current generated by the current generator 145, according to a second regulation loop. The second regulation loop performs a common offset correction. Thereby, the electrical currents generated by the two current generators 145 are controlled so as to correspond approximately to the DC component of the currents generated by the photodiodes P1, P2 in each of the two electric circuits 142. Such a regulation is an adaptation of the regulation technique known under the name "Common Mode Feedback" (CMFB).

It should be noted that the common offset regulation differs from a differential offset regulation, such as the regulation used in the document "Coherent ePIC Receiver for 64 GBaud QPSK in 0.25 μm Photonic BiCMOS Technology" (Journal of Lightwave Technology, vol. 37, No. 1, p. 103-109), made of bipolar SiGe having an $f_t$=190 GHZ. In said circuit of the prior art, the regulation acts separately on each of the current generators, in other words, there are two distinct control signals for the two offset current generators. On the other hand, in the embodiment described with reference to FIG. 6, the two current generators 145 are controlled by the same control signal so that the second regulation loop is advantageously combined with the first regulation loop in order to obtain a device for optimizing the signal-to-noise ratio, the respective operation of the regulation loops being described in detail hereinafter.

It should be noted that the amplifier 80 and the resistors 85 forming a circuit commonly called differential RTIA, with the second regulation loop, is used for regulation the mean value of the electrical potentials of the outputs 105, i.e. half of the sum thereof, so that the half of the sum is equal to a predetermined value, e.g. 1.65V if the amplifier is supplied between 0 and 3.3V.

During the operation of the conversion device, the activation of the first regulation loop makes it possible to act on the gain of the branches 45, 50 in a way similar to the second example described hereinabove. In the example shown in FIG. 4, the first regulation loop thereby acts on the transistor (s) of the circuit 150 which form the adjustment elements 42.

According to one embodiment, the first and second regulation loops are activated sequentially. The controller 100 determines, e.g. periodically, whether it is necessary to act on the generators 145 in order to modify the values of the currents that same generate.

Between two steps of adjustment of the generators 145, the first regulation loop is active and the gain of each branch 45, 50 is regulated by the regulation loop 87. In practice, the purpose of the first loop is to prevent the mean values of the signals present at the two outputs 105 from deviating from each other. In other words, the controls generated by the controller 100 ensure that the two outputs 105 each have substantially the same mean voltage values.

Therefore, each regulation loop has a role, the first loop ensures that the mean values of each of the two outputs are substantially identical, and the second loop ensures that the sum of the two outputs divided by two has a predefined value on average. Thereby, the output signals of the differential amplifier are generally "centered" around a setpoint voltage value, and the amplitude excursion of the output signals can thus be significant before the signals saturate.

It should be noted that the second regulation loop is not indispensable. The circuit can operate with only the first regulation loop which has the function to ensure that the two outputs have the same mean value and that the mean value is equal to a reference voltage value, e.g. 1.65V. Thereby, the output signals of the amplifier are generally centered around the reference voltage ensuring a maximum possible signal swing.

The interest of the second regulation loop lies mainly in the optimal adjustment of the current operation point of the photodiodes P1, P2. Indeed, if the second regulation loop were not present, the current generators would be controlled with a fixed control.

In the case of a fixed control of the current generators, the gain regulation (first regulation loop) would then attenuate or amplify the signal within the accessible range in order to obtain equality between the currents in the photodiodes P1, P2 and the currents in the current generators, so that the current split-off towards the RTIA from the branches 142, is zero on average. Since the power of the photonic signal entering the waveguide 40, as well as the dispersions of the splitter 60 and of the diodes P1, P2 are not known, the current imposed by the current generators 145 should correspond to a statistical worst case (in particular linked to technological dispersions) and a worst case of operation (in particular related to the variations in the input power) so that the gain regulation can function. The above is sub-optimal compared to a solution using a CMFB regulation loop which would make it possible to adapt to the photonic power entering the guide 40 and to the actual dispersions of the circuit in use.

The second regulation loop can thus be used for finding the maximum acceptable current in the current generators making it possible to satisfy the conditions of operation (i.e. a good operation of the first regulation loop). The higher the current in the photodiodes P1, P2, the higher the amplitude of the effective signal, making it possible to ultimately have a better signal-to-noise ratio of the output signal of the differential amplifier. As in the case of "single" architectures, the closed loop regulation on the gain or gains makes it possible, over a range of input power received by the photodiodes P1, P2, to prevent the saturation of the amplifier 80 caused by the dispersions of the components of the different branches 45 and 50, the imperfection of the splitter 60 and thus to amplify the variable part of the photonic signal more strongly than it is possible with the assemblies of the prior art.

Furthermore and not least, the gain regulation loop, in the different examples of embodiment described hereinabove, makes it possible to have a device insensitive to the variations of power of the transmission stage 15 over a given range of power of the photonic signal, by making it possible to correct any initial differences (before regulation) of individual gains between the first and second output branches and, if appropriate, any imperfection of the splitter 60. It should be noted that the above is not possible in practice in the case where a single offset regulation loop is used, whatever the assembly, with a single output or with two differential outputs.

According to another embodiment of the circuit shown in FIG. 6, the first and second regulation loops are permanently active. In order to prevent the action of one loop from interfering with the action of the other loop, a certain form of frequency/time response asymmetry can be provided for, in order to enhance the action of one of the loops over a given range of regulation frequency. As an indication, one can e.g. "favor" the second common offset regulation loop, by using a low-pass filter for the second loop which has a cut-off frequency (e.g. 100 kHz) higher than the cut-off frequency of the low-pass filter of the first regulation loop (e.g. 10 kHz).

Since the second regulation loop acts by shifting the two output voltages (105), which corresponds to a CMFB regulation, the loop cannot eliminate the effective AC signal. The passband of the second regulation loop is thus not required to be less than the frequency band of the effective signal AC.

The effective signal AC considered at the output of the amplifier 80 corresponds in practice to the heterodyne signal obtained for a FMCW lidar. The heterodyne signal has e.g. an effective frequency range comprised between 100 KHz and 100 MHz when the frequency chirp period is 10 microseconds, and that an observation window of the signal present on the output(s) 105 is produced over a minimum duration corresponding to the duration of a frequency chirp period.

In general, it is important to note that the purpose of the first regulation loop of the device having an amplifier with differential outputs, and of the single regulation loop of the devices having an amplifier with a single output, is to achieve gain regulation. The purpose of a gain regulation is to ensure that the DC component of the current in the branch 45, called I1$dc$, and the DC component of the current in the branch 50, called I2$dc$, are substantially equal (I1$dc$=I2$dc$). Such type of regulation is to be differentiated from an offset regulation for which it is sought to define, with an offset current Iref (the case of a single output) or two currents Iref1 and Iref2 (the case with two differential outputs), applied by one or a plurality of offset current generators, currents such as I1$dc$–I2$dc$=IREF (single output) or I1$dc$=Iref1 and I2$dc$=Iref2 (differential outputs), with Iref or Iref1 and Iref2 not equal to zero by construction of the circuits. Such type of offset regulation is widely used in the devices of the prior art and has the major drawback of not allowing the system to be insensitive to rapid variations in the power of the photonic signal because the value or values Iref are defined by a regulation which is necessarily slow and which will only work well for a given power value of the photonic signal to be analyzed. On the other hand, with gain regulation, the equality of the DC components I1$dc$ and I2$dc$ is preserved whatever the input power, within a power range of the third photonic signal predefined by construction. Thereby, for an FMCW lidar device, the input power range considered is defined from the power range of the corresponding emitted laser signal over the swept frequency range, taking into account a ratio corresponding to the power ratio between the power of the emitted laser and the power of the part of the laser split-off towards the conversion device 25.

As can be seen herein, the assembly with "single" architecture of the second example can be easily adapted to a differential architecture. It would be clear for a person skilled in the art that the other examples of lidars described in the present description can also be implemented with a differential architecture.

Differential architectures are of particular interest in environments and the installations with high electrical or electromagnetic noise, since same are less sensitive to such noise than single architectures.

It should be noted that, although the fourth example has been described in the case where the adjustment element 42 is a transistor in the electrical circuit portion 150, such type of architecture can also be used with other types of adjustment elements 42, e.g. with attenuators/amplifiers of the photonic flux, or current splitters, such as the adjustment elements of the first or third embodiments described supra.

In embodiments which do not include a transistor 110, the electrical circuit portion 150 is e.g. formed by an electric conductor connecting the current generator 145 and the anode of the photodiode P1, P2.

In general, a conversion device according to the invention can include one or a plurality of adjustment elements 42. Each adjustment element can be placed either in the photonic part after the splitter 60 in order to achieve an attenuation or an amplification of the photonic flux in an output branch, or in the electrical part in order to similarly achieve an attenuation or an amplification of the current delivered by one of the photodiodes P1, P2 of an output branch.

In the case where only one adjustment element is provided in the conversion device, in practice, it is necessary to ensure that the range of gain variations in the output branch incorporating the adjustment element will make possible to adapt to all possible values of the intrinsic gain of the other output branch (the gain of which cannot be modified).

If the range of gain modification by the adjustment element is small, or if the range is unidirectional, i.e. the gain adaptation is only a decrease (with attenuator) or a decrease (amplifier), it will probably be necessary to slightly dissymmetrize the powers injected into the output branches after the splitter 60.

Thereby, e.g., if a single attenuator is used in one of the output branches, and the other elements of the output branches have an identical design, it will then be necessary to send a little more power into the output branch having the attenuator in order to ensure that the power fed through the output branch with attenuator is not initially (before attenuation) lower than the power fed through the output branch without attenuator, in order to be able to use the regulation and to adjust the attenuation rate making it possible ultimately to equalize the currents leaving the output branches of the conversion element 30.

In the case where two adjustment devices are provided, with one adjustment device per output branch, then the splitter 60 will preferentially have to distribute the flux equally between the different output branches, the gain regulation loop shall preferentially be designed for favoring an action on one or other of the adjustment devices so as to maximize the current supplied by each of the output branches, in order to have a better signal-to-noise ratio in the effective signal leaving the differential amplifier on the output(s) 105.

Furthermore, in the case where several adjustment devices are used, two, three or more still, it is then desirable for the regulation loop to act at a given moment on only one of the adjustment devices by choosing same as explained hereinabove, so as to maximize the output current of each output branch.

Moreover, although the aforementioned embodiments use a differential amplifier, with two differential inputs, a person skilled in the art can easily adapt the proposed circuits in order to use a single amplifier, with a single input. The examples with a differential amplifier were preferred because same are in practice much more robust than the examples with a single amplifier.

It should be noted that, in the examples of lidar presented hereinabove, a single pair of branches 45, 50 is present.

It will be clear for a person skilled in the art that the number of pairs of output branches 45, 50 is likely to be greater than 1, the output branches of the same pair being phase-shifted by approximately 180° with respect to each other.

More particularly, the output branches of the different pairs have different phase shifts.

For example, two pairs of output branches 45, 50 are present, the branch 50 of the first pair being phase-shifted by approximately 180° with respect to the branch 45 of the first pair, the branch 45 of the second pair being phase-shifted by approximately 90° with respect to the branch 45 of the first pair, the branch 50 of the second pair being out of phase by approximately 270° with respect to the branch 45 of the first pair.

When there are four pairs, the phase shifts are e.g. 0°, 45°, 90°, 135°, 180°, 225°, 270° and 315°, and so on.

It should be noted that, in general, the phase shifts between the different pairs of output branches 45, 50 are likely to vary, as long as the phase shift between the two branches of each pair remains as close as possible to 180°.

Each pair of output branches 45, 50 is e.g. associated with a respective processing device 35 generating an output electrical current according to the photonic signals at the output of the branches 45, 50 of the pair considered.

The output signals of the different processing devices 35 are analyzed by one or a plurality of corresponding analysis devices 27 in order to calculate values of one or a plurality of parameters of the target C.

Although a single conversion device 25 including a single splitter 60 has been described hereinabove, it should be noted that embodiments wherein a conversion device 25 includes a plurality of elementary conversion devices 25, each elementary conversion device 25 being as described herein above, can also be envisaged.

In such case, each elementary conversion device 25 receives the same input photonic signal or signals.

For example, each elementary conversion device 25 includes a dedicated splitter 60 supplying the two branches 45, 50 of the elementary conversion device. In a variant, a single splitter 60 common to all the elementary conversion devices 25 generates pairs of output signals from the splitter 60, each signal of a pair being out of phase by approximately 180° with respect to the other signal of the pair and transmitting the pair of output signals to the branches 45, 50 of the corresponding elementary conversion device 25.

Moreover, it will be noted that in the preceding description of the embodiments, the amplifier delivering the output signal 105 has been referenced with the reference 80 without the feedback resistors 85. In practice, the differential amplifier 80 with the feedback resistors 85 forms an RTIA amplifier diagram. As a person skilled in the art will have understood, in the explanations given supra, a shortcut was regularly taken for referring to the RTIA assembly as the amplifier of the assembly, in particular in all the explanations on the regulation mechanisms.

The invention claimed is:

1. A device for converting a photonic signal to be analyzed, comprising:

a photonic-electric conversion element, and an electronic processing device, the conversion element including a splitter having two outputs connected to a first output branch and to a second output branch, respectively, the splitter including one or two inputs for receiving one or two input photonic signals, respectively, the splitter mixing the input photonic signals in a case where two inputs are present, the one received input photonic signal or the mixing of the two received photonic signals corresponding to a photonic signal to be analyzed, the splitter leading a first part of the photonic signal to be analyzed to the first output branch and leading a second part of the photonic signal to be analyzed to the second output branch, the conversion element being configured for imposing, via the splitter, a phase shift of approximately 180 degrees between the first and the second parts of the photonic signal to be analyzed, each of the first and second output branches including a waveguide portion and a photodiode, each photodiode being configured for generating a respective first electrical current in response to receiving the first or second part of the photonic signal to be analyzed, each output branch being configured for generating at the output, a second electrical current having a value equal to or a multiple of a value of the first electrical current of the output branch considered, the processing device comprising an amplifier configured for generating at least one output signal according to a difference between the values of the two second electrical currents, a gain being defined for each output branch, the gain being a coefficient of proportionality between the value of the second electrical current of the output branch considered and a photonic power of the first or second part of the photonic signal to be analyzed, received by the output branch, the conversion device including at least one electronically controlled adjustment element, configured to modify one of the gains, the processing device including a first regulation loop comprising a low-pass filter and a device for controlling each adjustment element, the regulation loop receiving the output signal from the amplifier and producing an electrical control signal for each adjustment element so as to regulate a mean value of each output signal to a predefined setpoint value corresponding to equalization of DC components of the values of the two second electrical currents, each photodiode has an anode and a cathode, at least one adjustment element being configured for modifying an electrical voltage between the anode and the cathode of the corresponding photodiode, and each photodiode having a quantum efficiency, the quantum efficiency of each photodiode being equal to a ratio between, in the numerator, a number of charge carriers generated per unit of time and, in the denominator, a number of photons illuminating the photodiode during a same unit of time, and at least one adjustment element being configured for modifying the quantum efficiency of a corresponding photodiode, the quantum efficiency of each photodiode being modified via modification of the electrical voltage between the anode and the cathode of the corresponding photodiode.

2. The conversion device according to claim 1, wherein each adjustment element is configured to modify a coefficient of proportionality between the value of the first electrical current of the corresponding output branch and the photonic power of the first or second part of the photonic signal to be analyzed received by the output branch.

3. The conversion device according to claim 1, wherein at least one adjustment element comprises a transistor connected in series with the photodiode of the corresponding output branch, the transistor comprising a gate or a base, the regulation loop being configured to modify a gate or base voltage of the transistor.

4. The conversion device according to claim 1, wherein the amplifier is a differential amplifier having an input connected to a voltage reference, the photodiodes of the two output branches being connected in series in a same direction with each other, the anode of one photodiode being connected to the cathode of the other, via an electrical circuit portion, a second input of the differential amplifier being electrically connected to an intermediate point of the electrical circuit portion.

5. The conversion device according to claim 4, wherein at least one adjustment element comprises a transistor connected in series with the photodiode of the corresponding output branch, the transistor comprising a gate or a base, the regulation loop being configured to modify a gate or base voltage of the transistor; and wherein the transistor connects the photodiode of the corresponding output branch and the intermediate point electrically connected to the second input of the differential amplifier.

6. The conversion device according to claim 1, wherein the conversion device comprises a second adjustment element including a current splitter, the current splitter being positioned between a photodiode of a given branch and an intermediate point electrically connected to an input of the amplifier and configured to modify a coefficient of proportionality between intensities of the first current and of a second current of the given branch.

7. The conversion device according to claim 1, wherein each output branch includes a current generator connected in series with the corresponding photodiode, each current generator being connected to the corresponding photodiode by a respective electrical circuit portion, the amplifier being a differential amplifier having first and second inputs, each correspondingly connected to an intermediate point of the respective electrical circuit portion, and wherein the differential amplifier is configured to generate two output signals, and further comprising a second regulation loop receiving the two output signals of the amplifier and producing a common electrical control signal of the current generators so as to regulate an average of voltages present on the two outputs to a predefined setpoint value, the first regulation loop producing an electrical control signal for at least one adjustment element so as to regulate an average of each voltage present on one of the outputs to a same predefined setpoint value corresponding to equalization of DC components of intensities of the second currents.

8. A conversion device including a plurality of elementary conversion devices according to claim 1, wherein the same input photonic signal or signals are fed into each elementary conversion device, the splitters of each of the devices being different or forming a single splitter shared by the conversion devices, the splitter or splitters forming a plurality of pairs of output signals, each pair of output signals being associated with an elementary conversion device and fed into the respective first and second output branches of the associated elementary conversion device, the signals of the same pair having a phase shift of approximately 180 degrees with respect to each other, the signals of different pairs having a phase shift with respect to each other, and wherein the output signals of the amplifiers of the elementary conversion devices are transmitted to an analysis device.

9. The conversion device according to claim 8, including two elementary conversion devices, and wherein the four output signals of the at least one splitter are in phase quadrature.

10. A lidar including a transmission stage for transmitting a photonic signal to a target, a reception stage for receiving a photonic signal scattered by the target and a conversion device according to claim 1, the transmission stage being configured to inject a part of the transmitted signal into one of the inputs of the splitter or into a waveguide forming an input branch connected to an input of the splitter, the reception stage being configured to inject the scattered signal into another input of the splitter or into the waveguide forming the input branch, the photonic signal to be analyzed being formed by mixing the signals injected into the two inputs of the splitter or into the waveguide forming the input branch.

11. A method for controlling a conversion device including:

a photonic-electric conversion element, and an electronic processing device, the conversion element including a splitter having two outputs connected to a first output branch and to a second output branch, respectively, the splitter including one or two inputs for receiving one or two input photonic signals, respectively, the splitter mixing the input photonic signals in a case where two inputs are present, the one received input photonic signal or the mixing of the signals corresponding to a photonic signal to be analyzed, the splitter leading a first part of the photonic signal to be analyzed to the first output branch and leading a second part of the photonic signal to be analyzed to the second output branch, the conversion elements being configured for imposing, via the splitter, a phase shift of approximately 180 degrees between the first and the second parts of the photonic signal to be analyzed, each first or second output branch including a waveguide portion and a photodiode, each photodiode being configured to generate a respective first electrical current in response to the reception of the first or second part of the photonic signal to be analyzed, each photodiode having a quantum efficiency, the quantum efficiency of each photodiode being equal to a ratio between, in the numerator, a number of charge carriers generated per unit of time and, in the denominator, a number of photons illuminating the photodiode during the same unit of time, each output branch being configured to generate a second electrical current having a value equal to or multiple of a value of the first electrical current of the output branch considered, the processing device comprising an amplifier configured for generating at least one output signal according to a difference between the values of the two electrical currents, a gain being defined for each output branch, the gain being a coefficient of proportionality between a value of the second electrical current of the output branch considered and a photonic power of the first or second part of the photonic signal to be analyzed, received by the output branch, the method including the steps of:

low-pass filtering, by a regulation loop, of the output signal, for obtaining a filtered signal, generating, using the regulation loop, according to the filtered signal, of an electrical control signal for at least one electronically controlled adjustment element, each photodiode has an anode and a cathode, at least one adjustment element being configured for modifying an electrical voltage between the anode and the cathode of the corresponding photodiode, and transmitting the control signal to the adjustment element and modification of one of the first gains by the adjustment element depending on the control signal received, so as to regulate a mean value of each output signal to a predefined setpoint value corresponding to equalization of DC components of the values of the two second electrical currents, at least one adjustment element modifying the quantum efficiency of a corresponding photodiode, the quantum efficiency of each photodiode being modified via modification of the electrical voltage between the anode and the cathode of the corresponding photodiode.

* * * * *